United States Patent [19]

Goodrich et al.

[11] Patent Number: 4,535,350
[45] Date of Patent: Aug. 13, 1985

[54] LOW-COST SEMICONDUCTOR DEVICE PACKAGE AND PROCESS

[75] Inventors: Gary B. Goodrich; Jadish G. Belani, both of Cupertino, Calif.

[73] Assignee: National Semiconductor Corporation, Santa Clara, Calif.

[21] Appl. No.: 626,428

[22] Filed: Jun. 29, 1984

Related U.S. Application Data

[62] Division of Ser. No. 316,310, Oct. 29, 1981.

[51] Int. Cl.³ .................... H01L 23/02; H01L 39/02
[52] U.S. Cl. ............................................ 357/74; 357/80
[58] Field of Search .............................. 357/74, 72, 80

[56] References Cited

U.S. PATENT DOCUMENTS

| | | | |
|---|---|---|---|
| 3,113,252 | 12/1963 | Matea | 357/81 |
| 3,179,634 | 4/1965 | Edwards | 260/78 |
| 3,288,754 | 11/1966 | Green | 260/47 |
| 3,568,012 | 2/1971 | Ernst | 357/72 |
| 3,615,913 | 10/1971 | Shaw | 357/54 |
| 4,017,886 | 4/1977 | Tomono | 357/71 |
| 4,142,203 | 2/1979 | Dietz | 357/74 |
| 4,417,386 | 11/1983 | Exner | 357/71 |
| 4,423,435 | 12/1983 | Test | 357/80 |

Primary Examiner—Andrew J. James
Assistant Examiner—Mark Prenty
Attorney, Agent, or Firm—Willis E. Higgins; Gail W. Woodward; Paul F. Winters

[57] ABSTRACT

An adhesive composition for attaching semiconductor die to a substrate of a semiconductor device package includes a crosslinkable resinous polyimide, and an aminosilane crosslinking agent. For applications where backside contact to the semiconductor die is desired, the composition also contains finely divided conductive metal, such as silver flakes. When used in a novel process in which the adhesive composition is placed on the semiconductor device substrate prior to gelling, outgassed, a semiconductor die is placed on the outgassed composition, and the composition cured, the resulting semiconductor device package meets military specifications with a substantial cost reduction.

6 Claims, 1 Drawing Figure

LOW-COST SEMICONDUCTOR DEVICE PACKAGE AND PROCESS

This is a divisional of co-pending application Ser. No. 316,310 filed on Oct. 29, 1981.

BACKGROUND OF THE INVENTION

A. Field of the Invention

This invention relates to an organic adhesive composition for attaching a semiconductor die in a package for the die, which adhesive will withstand high temperatures employed to provide an hermetic seal in the package. It further relates to an improved, low-cost ceramic package for a semiconductor die, which package utilizes the high temperature stable adhesive to mount the semiconductor die in the package. The invention further relates to a novel process for providing the semiconductor device package incorporating the adhesive.

B. Description of the Prior Art

A variety of organic coating and adhesive materials are known for use with semiconductor devices. Such materials are disclosed in, for example, U.S. Pat. Nos. 3,568,012, 3,788,895, and commonly assigned U.S. Pat. No. 3,838,094. While such materials have been proved to be useful in the manufacture of low cost semiconductor device packages for the commercial market, they have generally not proved suitable for use when it is necessary to employ very high temperature sealing processes in subsequent completion of semiconductor device packages. For example, in the present fabrication of ceramic dual-in-line packages for military applications, it is conventional practice to employ a temperature of about 460° C. in the formation of a hermetic seal for the semiconductor die in the package. While progress has been made in increasing the temperature stability of adhesives for semiconductor die, as reported in U.S. Pat. No. 4,233,103, the compositions disclosed there will not provide a shear strength suitable for military specification packages. As a result, military procurement has not qualified any prior art adhesive composition for use.

While the prior art also discloses a wide variety of adhesive formulations for other applications, such as in U.S. Pat. Nos. 3,416,994; 3,073,784; 4,088,801; 3,767,519; 3,726,834; and Russian Pat. No. 405,927, an adhesive composition for use at such elevated temperatures as 460° C. in semiconductor device packages has not been provided in the prior art.

SUMMARY OF THE INVENTION

Accordingly, it is an object of this invention to provide a novel adhesive composition for attaching a semiconductor die in a package, which composition will withstand very high temperatures utilized to provide hermetic seals in the semiconductor device package.

It is another object of this invention to provide such an adhesive composition which can be used to provide semiconductor device packages meeting military specifications.

It is another object of the invention to provide a semiconductor device package utilizing an organic material for attaching a semiconductor die in the package, which package will meet military performance specifications.

It is still another object of the invention to provide such a semiconductor device package meeting military performance specifications which has an improved operating life over conventional military specification packages.

It is still another object of the invention to provide a novel process for attaching a semiconductor die to a substrate by means of an organic adhesive which will withstand temperatures employed to produce hermetically sealed packages.

The attainment of the foregoing and related objects may be achieved through use of the novel, high-temperature, stable organic adhesive material, semiconductor device package and process for providing a semiconductor device package herein disclosed. A composition for attaching semiconductor die to a ceramic substrate in accordance with the invention includes a crosslinkable resinous polyimide precursor in a polar organic solvent, such as N-methyl-2-pyrrolidine. The resin is typically present in the solvent in a proportion of about 38 to about 42 weight percent solids, remainder solvent. The composition further contains an aminosilane crosslinking agent for the resinous polyimide precursor, such as an alkylaminotrialkoxysilane, with gamma-aminopropyltriethoxysilane being particularly preferred. The aminosilane crosslinking agent is typically present in a weight ratio of from about 0.010 to about 0.030 of the resin and solvent, with a weight ratio of from about 0.014 to about 0.021 being preferred.

In the case of a semiconductor die for which backside electrical contact to the die is required, for example, to connect the die to a ground or other reference potential, the composition in accordance with this invention also contains a finely divided conductive metal. The finely divided conductive metal is preferably in the form of flakes having a size of about 0.05 microns to about 4 microns (average 1.5 microns), with silver being especially preferred as the conductive metal. The silver flakes, if employed, are typically present in a weight ratio of from about 0.40 to about 0.90 of the resin and solvent to silver flakes, with a weight ratio of from about 0.50 to about 0.75 being preferred.

The polar organic solvent for the polyimide precursor also acts as a solvent for the aminosilane crosslinking agent. A polar organic solvent, such as a dimethylformamide or N-methyl-2-pyrrolidone with N-methyl-2-pyrrolidone is especially preferred.

In its preferred form, the composition of this invention is desirably mixed at the point of use, since the aminosilane crosslinking agent is sufficiently fast acting that the composition will gel within about a day or so at room temperature, and it is no longer suitable for use once it has gelled. The composition is preferably used in a novel encapsulating process to give a completed semiconductor device package in accordance with the invention. The process for encapsulating a semiconductor die includes the step of adding a silane crosslinking agent to a crosslinkable resinous polyimide precursor. The resulting composition is then de-gassed in a vacuum, preferably in repeated steps with stirring between each step, until the composition expands no more than 50% under vacuum. The de-gassed composition is then applied to a substrate which will form part of the completed package, prior to gelling of the composition. A semiconductor die is positioned on the de-gassed composition and substrate. The de-gassed composition is then cured to attach the semiconductor die to the substrate. The attached semiconductor die is then hermetically sealed by application and bonding of a suitable enclosure over the attached semiconductor die. With a ceramic substrate, the hermetic seal is preferably formed by application of heat at least about 450° C. to form an hermetic seal between the ceramic substrate and the enclosure over the semiconductor die.

A novel, hermetically sealed semiconductor device package in accordance with this invention includes a ceramic substrate. A semiconductor die is attached to the ceramic substrate by means of a body of cured polyimide resinous material which contains a finally divided conductive metal when electrical contact to the backside of the semiconductor die is desired. An enclosure covers the semiconductor die and the body of cured polyimide resinous material. The enclosure is in sealed relationship with the ceramic substrate, so that the enclosure, body of cured resinous material and ceramic substrate provide hermetic isolation for the semiconductor die. The cured polyimide resinous material is preferably provided from the novel composition of this invention.

The attainment of the foregoing and related objects, advantages and features of the invention should be more readily apparent to those skilled in the art after review of the following more detailed description of the invention, taken together with the drawings, in which:

BRIEF DESCRIPTION OF THE DRAWINGS

The sole FIGURE is a cross-section view of a semiconductor device package in accordance with the invention.

DETAILED DESCRIPTION OF THE INVENTION

Figure 1:
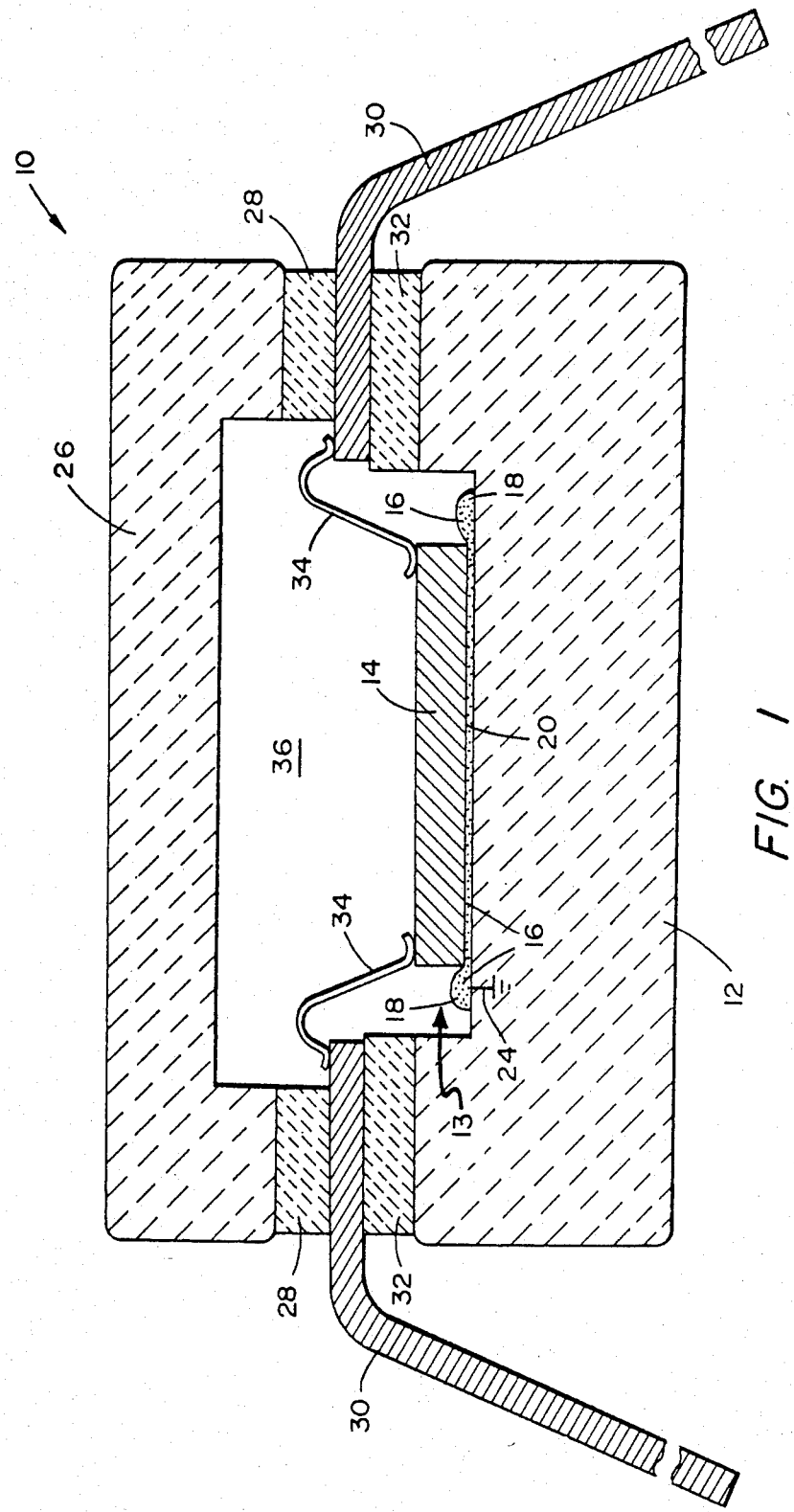

The crosslinkable, resinous polyimide precursor used in the composition and process of this invention when cured, desirably has a recurring unit of the formula:

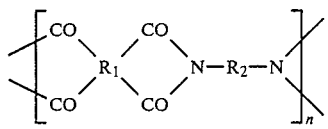

wherein $R_1$ and $R_2$ are radicals of a tetravalent aromatic group, and a divalent aromatic group, respectively, and n is a positive integer. Resins of this type are well known in the art, and may be prepared as a condensation product of an aromatic dicarboxylic dianhydride with an aromatic diamine. Such resins and processes for preparing them are further described in U.S. Pat. No. 3,179,634, and are commercially available from E. I. du Pont de Nemours and Company, Wilmington, Del., under the trademark "Pyre-ML."

The aminosilane crosslinking agent used in the composition of this invention desirably has at least one amino-functional group and at least one anorgano-functional group. Suitable examples of amino-functional groups include amino, alkylamino and arylamino groups, and the like. Suitable specific examples of anorgano-functional groups include methoxy, ethoxy, and acetoxy groups, and the like. Appropriately substituted silanes including such functional groups may be prepared by methods known to those skilled in the art. A preferred class of substituted silanes useful as the crosslinking agent are the alkylaminotrialkoxysilanes, with gamma-aminopropyltriethoxysilane being especially preferred. Other operable aminosilane crosslinking agents include gamma-aminopropyltrimethoxysilane, bis-hydroxy-ethyl-gamma-amino-propyl-triethoxysilane, bis-acrylic acid-gamma-amino-propyl-triethoxysilane, N-beta(aminoethyl)-gamma-aminopropyltrimethoxysilane, methyl[2-(gamma-trimethoxysilylpropylamino)ethyl-amino]3-propionate, and the like.

In a preferred form of the invention, the composition also includes conductive metal flakes, so that electrical contact to the backside of the semiconductor die may be made through the cured composition of this invention. Silver flakes are preferred for this purpose. Other conductive metals are also operable, such as a finely divided mixture of palladium and silver or platinum and silver, or the like. In another preferred form of the invention, finely divided alumina, quartz or other low expansion coefficient insulating fillers, which also give improved thermal conductivity to the composition, are included in place of the metal flakes. These fillers can be used in corresponding weight ratios and particle sizes as the conductive metal flakes. The preferred silver flakes are commercially available from Metz Metallurgical, Inc., South Plainfield, N.J.

Turning now the the sole FIGURE of drawing, there is shown a hermetically sealed semiconductor device package 10 in accordance with the invention. The package includes a ceramic substrate 12 having a recess 13 dimensioned to receive integrated circuit semiconductor die 14. The semiconductor die 14 is attached to the ceramic substrate 12 by means of a body 16 of cured polyimide resinous material incorporating finely divided silver flakes 18. The cured body 16 contains from about 80 to about 87 percent by weight of the silver flakes 18. The body 16 of cured polyimide resinous material is prepared from a composition in accordance with this invention, utilizing the process for forming the semiconductor device package in accordance with the invention. The body 16 of cured polyimide resinous material serves to make electrical contact to backside 20 of the semiconductor die 14. Body 16 is connected to ground as indicated at 24. A ceramic lid 26 covers the semiconductor die 14 and the body 16 of cured polyimide resinous material. The lid 26 is in sealed relationship with the ceramic substrate 12 by means of glass layer 28, metal lead frame 30, and glass layer 32. Aluminum wire bonds 34 connect the semiconductor die 14 to lead frame 30. The package thus defines a hermetically sealed enclosure 36 for the semiconductor die 14.

The semiconductor device package shown in FIG. 1 provides superior performance over conventional gold-silicon eutectic semiconductor die attached device packages fabricated for meeting military specifications. This superior performance is measured as less moisture in the gas space 36 of the package than a comparable package utilizing gold-silicon eutectic die attach in the conventional manner. Further, the operating life of the semiconductor device packages of FIG. 1 is more consistent than that obtained with gold-silicon eutectic die attach. While Applicants do not wish to be bound by any particular theory of operation, it is believed that this latter result is due to the fact that the body 16 of cured resinous polyimide material is less rigid than a corresponding body of gold-silicon eutectic. There is therefore less strain in the body 16 than in a gold-silicon eutectic junction. In addition to the above superior results compared to semiconductor device packages with gold-silicon eutectic die attach junctions, the body 16 of cured resinous polyimide material produces die shear strengths equal to those obtained with gold-silicon eutectic die attach, even after the formation of high temperature hermetic seals at 460° C. Further, heat dissipation in the package 10 is equal to that obtained with gold-silicon eutectic die attach packages, and backside electrical contact through the body 16 of cured polyimide resinous material is of lower resistance than backside electrical contact of the semiconductor die 14 through a gold-silicon eutectic after both types of packages have been cycled through 600 temperature cycles between 55° and 150° C.

EXAMPLE I

A quantity of 12.8 g of Pyre ML Resin PI-2561 obtained from E. I. du Pont de Nemours and Company, consisting of polyimide precursor resin in N-methyl-2-pyrrolidone solvent is weighed out. A quantity of 0.192 g of gamma-aminopropyltriethoxysilane is added to the resin solution in approximately 0.1 g stepwise increments, with stirring to produce a homogenous mixture after each addition. A quantity of 17.64 g of silver flakes having a size of about 0.5 microns to about 4 microns and an average size of 1.5 microns is added to the mixture stepwise in 5 g portions with stirring to produce a homogenous mixture after each addition. The viscosity of the mixture is determined to be between 38,000 and 45,000 centipoises using a Brookfield viscometer, Model RBT, Spindle SC4-15, Chamber SC4-7, Speed 5, with the mixture maintained at 30°±1° C.

The above composition is outgassed in accordance with the following procedure: The composition is spread with a spatula on a clean glass plate to a thickness of about 1/16 inch (1.6 mm). The composition on the glass plate is then placed in a vacuum chamber at 20 to 26 inches (51 cm to 66 cm) of mercury for three minutes. The composition is stirred carefully with the spatula, maintaining the thickness on the glass plate. The composition is cycled in the vacuum chamber in this manner for five times or until it expands no more than 50 percent under the vacuum.

The unmixed resin is stored at 4° C. until mixing, then allowed to reach room temperature before opening its container. Similarly, the mixed, degassed composition is stored at 0°±3° C. until use, and allowed to reach room temperature before opening its container.

The mixed, degassed composition is applied to ceramic dual-in-line package substrates in a drop about half the size of a semiconductor die to be attached to each substrate. The semiconductor die is positioned on each substrate and scrubbed gently until the adhesive composition wets the lower edge of the semiconductor die on all four sides. The die is then pressed into the composition until it touches the substrate. The adhesive is then heat cured at 125° C. for two hours and 180° C. for two hours. A lead frame is positioned over the substrate, wire bonding carried out, a ceramic cap placed over the lead frame, and the assembly is sealed with glass layers between the lead frame, the substrate, and the cap, by means of ramp heating and cooling and a temperature of 460° C. for eight minutes. The resulting completed package is shown in the drawing.

The completed packages are tested for die shear along with comparative packages utilizing conventional gold-silicon eutectic die attach, otherwise fabricated in accordance with the above procedure. The results obtained are shown in Table I.

TABLE I

| | Die Shear, kg | | | |
| | After Cure | | After Seal | |
| | Polyimide | Au—Si | Polyimide | Au—Si |
|---|---|---|---|---|
| Min. | 1.42 | 0.82 | 1.98 | 1.48 |
| Max. | 2.32 | 2.72 | 3.05 | 2.38 |
| Avg. | 1.92 | 1.91 | 2.53 | 1.91 |
| Quan. | 10 | 10 | 5 | 5 |

These results show less spread in die shear measurements for the adhesive composition of this invention than the conventional gold-silicon eutectic die attach, both before and after sealing.

EXAMPLE II

The procedure of Example I was repeated with additional samples with results as shown in Table II below:

TABLE II

| | Die Shear, kg | | | |
| | After Cure | | After Seal | |
| | Polyimide | Au—Si | Polyimide | Au—Si |
|---|---|---|---|---|
| | (1) | | (1) | |
| Min. | 1.54 | 2.21 | 3.27 | 1.91 |
| Max. | 4.81 | 3.79 | 4.06 | 5.08 |
| Avg. | 3.05 | 3.07 | 3.73 | 3.62 |
| Quan. | 7 | 7 | 5 | 5 |
| | (2) | | (2) | |
| Min. | 2.44 | 1.50 | 1.3 | 0.78 |
| Max. | 3.55 | 3.05 | 3.05 | 2.46 |
| Avg. | 3.02 | 1.86 | 2.03 | 1.49 |
| Quan. | 5 | 5 | 5 | 5 |

These results confirm the conclusion of Example I.

EXAMPLE III

Ceramic packages of LM301 operational amplifier integrated circuits were fabricated in accordance with the procedure of Example I, but with cure times for the polyimide die attach adhesive composition as noted in Table III. Comparative gold-silicon eutectic die attach packages were fabricated according to their standard manufacturing process. These packaged LM301 circuits were subjected to a 150° C. operating lifetime test, with measurement of input offset voltage drift after 168 hours and 336 hours, giving the results shown in Table III.

TABLE III

| | 168 Hours at 150° C. | | 336 Hours at 150° C. | |
| | Quan. | Input Offset Voltage Drift, MV | Quan. | Input Offset Voltage Drift, MV |
|---|---|---|---|---|
| Au—Si Die Attach | 25 | 0.12 Ave. 0.71 Max. | 25 | 0.16 Ave. 0.81 Max. |
| Polyimide Die Attach Cure at 180° C., 2 hours | 25 | 0.05 Ave 0.40 Max. | 25 | 0.05 Ave. 0.45 Max. |
| Polyimide Die Attach Cure at 180° C., 2 hours 390° C., 15 minutes | 25 | 0.06 Ave. 0.32 Max. | 25 | 0.05 Ave. 0.36 Max. |

These results show both a lower average input offset voltage drift and a lower maximum input offset voltage drift for the LM301 integrated circuits packaged using this invention compared with the LM301 integrated circuits packaged using conventional gold-silicon die attach.

EXAMPLE IV

Sample integrated circuit packages with polyimide resin die attach in accordance with Example I and comparative standard gold-silicon eutectic die attach packages as controls were subjected to mass spectral analysis of the gas space 36 for moisture content, with the results shown in Table IV.

TABLE IV

| Sample | Total Pressure, Torr | H₂O Content, ppm |
|---|---|---|
| 1 | 0.044 | * |
| 2 | 0.047 | 12 |
| 3 | 0.054 | 31 |
| 4 | 0.048 | 13 |
| Control 1 | 0.047 | 935 |
| Control 2 | 0.047 | 609 |

*Not measurable, probably less than 100 ppm.

These results show moisture readings on the units utilizing the present invention for die attach are better by at least a factor of ten over the control units. It should be recognized that moisture is a significant reliability detractor in integrated circuit packages.

Substitution of other polyimide resins as described above and other crosslinking agents as described above in the procedures of the above examples gives similar, advantageous results.

It should now be apparent to those skilled in the art that a novel adhesive composition, semiconductor device package, and process for fabricating the semiconductor device package capable of achieving the stated objects of the invention has been provided. The adhesive composition will withstand temperatures of 460° C. used to form an hermetic seal in the package. The use of this adhesive composition gives more consistent die attach shear strengths than conventional gold-silicon eutectic die attach. The operating life of the resulting packages is substantially more consistent than that obtained with comparable packages having gold-silicon eutectic die attach. The use of this adhesive composition and the novel outgassing step in the process of this invention gives semiconductor device packages containing less moisture than comparable packages utilizing conventional gold-silicon eutectic die attach. Other performance characteristics of the packages of this invention are at least equal to those achieved with the conventional gold-silicon eutectic die attach. As a result, the semiconductor device packages of this invention are able to meet military performance specifications with a substantial cost saving over the conventional gold-silicon eutectic die attach packages.

It should further be apparent to those skilled in the art that various changes in form and details of the invention as shown and described may be made. It is intended that such changes be included within the spirit and scope of the claims appended hereto.

What is claimed is:

1. An hermetically sealed semiconductor device package, which comprises:
   a ceramic substrate,
   a semiconductor die,
   a body of cured polyimide resinous material cured from a composition containing a crosslinkable resinous polyimide precursor which will cure to give a polyimide having a recurring unit of the formula:

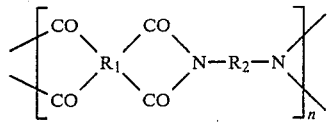

in which $R_1$ and $R_2$ are radicals of a tetravalent aromatic group and a divalent aromatic group, respectively, and n is a positive integer, a sufficient amount of an alkylaminotrialkoxysilane crosslinking agent to cure said resinous polyimide precursor, a sufficient amount of a finely divided conductive metal to render said composition conductive in the cured state and a polar organic solvent for said polyimide precursor and alkylaminotrialkoxysilane crosslinking agent, said body of cured polyimide resinous material containing the finely divided conductive metal, said body attaching said semiconductor die to said ceramic substrate, and
   a closure covering said semiconductor die and said body of cured polyimide resinous material, said closure being in sealed relationship with said ceramic substrate, so that said closure, body of cured resinous material and ceramic substrate provide hermetic isolation for said semiconductor die.

2. The package of claim 1 in which said enclosure comprises a ceramic lid sealed by glass to said ceramic substrate.

3. The package of claim 2 additionally comprising a lead frame extending through the glass and being electrically connected to said semiconductor die.

4. In a hermetically sealed semiconductor device package having a semiconductor die attached to a substrate, the improvement comprising a body of resinous material cured from a composition containing a crosslinkable resinous polyimide precursor which will cure to give a polyimide having a recurring unit of the formula:

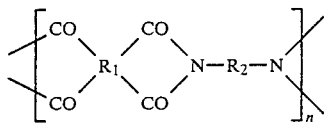

in which $R_1$ and $R_2$ are radicals of a tetravalent aromatic group and a divalent aromatic group, respectively, and n is a positive integer, a sufficient amount of an aminosilane crosslinking agent to cure said resinous polyimide precursor, a sufficient amount of a finely divided conductive metal to render said composition conductive in the cured state and a polar organic solvent for said polyimide precursor and aminosilane crosslinking agent, said body of cured polyimide resinous material containing the finely divided conductive metal, said body attaching said semiconductive die to said ceramic substrate.

5. The package of claim 4 in which said aminosilane crosslinking agent is an alkylaminotrialkoxysilane.

6. The package of claim 5 in which the aminosilane crosslinking agent is gamma-aminopropyltriethoxysilane.

* * * * *